(12) United States Patent
Morales Serrano et al.

(10) Patent No.: US 6,657,361 B1
(45) Date of Patent: Dec. 2, 2003

(54) PIEZOELECTRIC DRIVE DEVICE

(75) Inventors: Francisco Morales Serrano, Aachen (DE); Josef Lauter, Geilenkirchen (DE); Christian Reichinger, Alsdorf (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 245 days.

(21) Appl. No.: 09/652,934

(22) Filed: Aug. 31, 2000

(30) Foreign Application Priority Data

Sep. 4, 1999 (DE) .......................................... 199 42 269

(51) Int. Cl.⁷ .............................................. H01L 41/08
(52) U.S. Cl. ............................. 310/316.01; 310/316.02; 310/323.02
(58) Field of Search ...................... 310/323.02, 323.12, 310/323.16, 316.01, 316.02

(56) References Cited

U.S. PATENT DOCUMENTS

| | | | | |
|---|---|---|---|---|
| 5,173,631 A | * | 12/1992 | Suganuma | 310/316.02 |
| 5,777,423 A | * | 7/1998 | Zumeris | 310/323.02 |
| 5,920,144 A | * | 7/1999 | Atsuta | 310/316.02 |
| 5,949,177 A | * | 9/1999 | O'Brien et al. | 310/316.01 |
| 6,121,717 A | * | 9/2000 | Diefenbach et al. | 310/323.02 |
| 6,384,514 B1 | * | 5/2002 | Slutsky et al. | 310/323.17 |

FOREIGN PATENT DOCUMENTS

EP 0633616 A2 1/1995

* cited by examiner

*Primary Examiner*—Mark Budd
(74) *Attorney, Agent, or Firm*—Ernestine C. Bartlett

(57) ABSTRACT

The invention relates to a piezoelectric drive device with a bimodal piezoelectric resonator, with at least a first control electrode for triggering the resonator in a first drive direction, with at least a second control electrode for triggering the resonator in a second drive direction, and with a trigger circuit for supplying control signals to the first and the second control electrode. The invention is characterized in that a regulating circuit is provided for regulating the control signals, the second control electrode is designed for supplying a feedback signal to the regulating circuit when the resonator is being triggered in the first drive direction by means of the first control electrode, and the first control electrode is designed for supplying a feedback signal to the regulating circuit when the resonator is being triggered in the second drive direction by means of the second control electrode.

20 Claims, 3 Drawing Sheets

PIEZOELECTRIC DRIVE DEVICE

BACKGROUND OF THE INVENTION

The invention relates to a piezoelectric drive device with a bimodal piezoelectric resonator, with at least a first control electrode for triggering the resonator in a first drive direction, with at least a second control electrode for triggering the resonator in a second drive direction, and with a trigger circuit for supplying control signals to the first and the second control electrode.

Such a piezoelectric drive device is known from EP 633 616 A2. This known drive device comprises as its piezoelectric resonator a rectangular piezoelectric plate with four control electrodes, two control electrodes being provided for triggering the resonator in the first drive direction and the other two control electrodes for triggering the resonator in the second drive direction.

SUMMARY OF THE INVENTION

It is an object of the invention to provide a drive device of the kind mentioned in the opening paragraph which has an improved efficiency.

According to the invention, this object is achieved in that a regulating circuit is provided for regulating the control signals, the second control electrode is designed for supplying a feedback signal to the regulating circuit when the resonator is being triggered in the first drive direction by means of the first control electrode, and the first control electrode is designed for supplying a feedback signal to the regulating circuit when the resonator is being triggered in the second drive direction by means of the second control electrode.

More specifically, a piezoelectric drive device is provided comprising a bimodal piezoelectric resonator (1), and means for supplying control signals (S), wherein the resonator (1) comprises:

at least a first control electrode (2) for triggering the resonator (1) in a first drive direction, and at least an other control electrode (4) for triggering the resonator in a second drive direction, and said means for supplying control signals comprises a trigger circuit (6) for supplying control signals (S) to the first and the other control electrode, characterized in that a regulating circuit (7) is provided for regulating the control signals (S), first means for supplying a feedback signal (k) from the other control electrode (4) to the regulating circuit (7) when the resonator is not being triggered by said other control electrode and the resonator (1) is not being triggered in the first drive direction by means of the first control electrode (2), and second means for supplying the feedback signal (k) form the first control electrode (2) to the regulating circuit (7) when the resonator is not being triggered by the first control electrode and the resonator (1) is being triggered in the second drive direction by means of the other control electrode (4).

Such a drive device can be realized with a high efficiency. It is necessary for piezoelectric drive devices with high efficiency that the piezoelectric resonator should have a high performance. In the case of high resonator performances, the gradient of the performance over the frequency shows a narrow band. The optimum frequency, i.e. the frequency at which the resonator shows the best performance, is dependent on, for example, the amplitude of the control voltage supplied to the control electrodes, the mechanical prestress of the resonator, mechanical tolerances in the construction, and changes in the load. It is possible by means of the regulating circuit to adjust the control signal supplied to the control electrodes such that an optimum efficiency of the drive device is obtained at all times.

The relevant passive control electrode, i.e. that control electrode which is not being triggered in the instantaneous drive direction, is designed for obtaining the feedback signal necessary for the regulation at each moment. This renders possible an optimized utilization of the surface area of the piezoelectric resonator. No additional sensor electrodes are necessary for obtaining the feedback signal. Additional sensor electrodes would reduce the surface area available for the control electrodes and thus the active piezo volume, i.e. the volume lying under the control electrode surfaces.

In the one embodiment of the invention, wherein the other control electrode is a third electrode (4), the piezoelectric resonator (1) comprises a first pair of control electrodes (2,3) for triggering the resonator in the first drive direction, and a second pair of control electrodes (4,5) for triggering the resonator in the second drive direction, the second pair of control electrodes (4,5) is designed for supplying a feedback signal (k) to the regulating circuit (7) when the resonator is not being triggered by the second pair of electrodes and the resonator (1) is being triggered in the first drive direction by the first pair of control electrodes (2,3), and the first pair of control electrodes (2,3) is designed for supplying a feedback signal (k) to the regulating circuit (7) when the resonator is not being triggered by the first pair of electrodes and the resonator (1) is being triggered in the second drive direction by the second pair of control electrodes (4,5). In this embodiment, a first and a second control electrode pair are provided for triggering the relevant drive directions. The active piezo volume, i.e. the volume lying below the control electrodes, should be as great as possible so as to obtain a high energy density and a maximum output power. The arrangement of the control electrodes in pairs renders possible a good space utilization on the surface of the piezoelectric resonator.

The arrangement of the control electrodes in pairs is particularly favorable in an embodiment of the invention wherein the piezoelectric resonator (1) is substantially rectangular in shape, and one control electrode is provided in each quadrant of the substantially rectangular piezoelectric resonator (1). The substantially rectangular piezoelectric resonators are polarized in the thickness direction, and the oscillation modes are preferably stimulated by the D-31 piezo effect.

The amplitude evaluation provided in another embodiment of the invention wherein the regulating circuit (7) is designed for evaluating the amplitude of the feedback signal (k), takes place preferably by means of an analog-digital converter. The control circuit compares either the amplitude of the feedback signal with a programmable reference value or the amplitude of the feedback signal with the amplitude of the control signal, and derives the regulating signal therefrom.

In another embodiment of the invention, the regulating circuit (7) is designed for evaluating the phase difference between the control signal (s) and the feedback signal (k) by means of a phase control (PLL) circuit. This embodiment can be realized in a particularly simple and inexpensive manner, because no analog-digital converter is required.

The regulating circuit (7) is designed for regulating the frequency of the control signal (s). Such frequency regulation of the control signal renders it possible to operate the piezoelectric resonator continuously with the highest possible performance.

The regulating circuit (7) is also designed for regulating the amplitude of the control signal (s). This has the advantage that the output power of the motor can be regulated thereby.

It is particularly advantageous to combine the regulation of the frequency and the regulation of the amplitude. In the advantageous embodiment of the invention as defined in claim 8, this takes place in a first step through regulation of the frequency of the control signal. This safeguards an optimum performance of the piezoelectric resonator. Advantageously, the amplitude of the control signal can subsequently be regulated in a second step, for example for achieving a desired output power or a desired torque.

The drive device may preferably be used for driving the shaving head of a shaver or for driving the write/read unit of an electronic device for reading data stored on disc-type data carriers, in particular CDs and DVDs, and/or writing data on such disc-type data carriers.

BRIEF DESCRIPTION OF THE DRAWINGS

A few embodiments of the invention diagrammatically depicted in FIGS. 1 to 6 will now be explained in more detail with reference to these Figures, in which.

DESCRIPTION OF THE PREFERRED EMBODIMENTS

Figure 1:
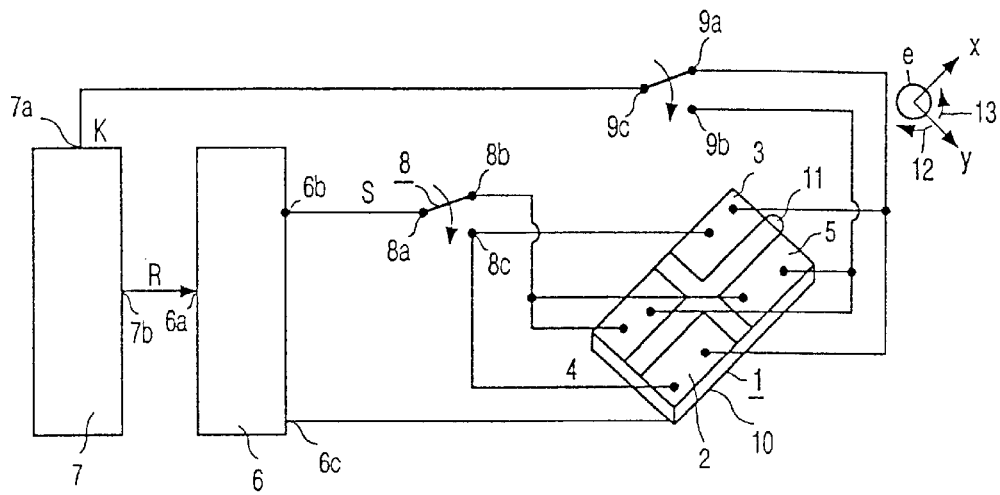
FIG. 1 is a perspective view of a piezoelectric resonator with four control electrodes, wherein each pair of diagonally opposed control electrodes can be coupled on the one hand to a regulating circuit and on the other hand to a control circuit.

FIG. 1 shows a substantially rectangular piezoelectric resonator 1 in perspective view, comprising a first control electrode 2, a second control electrode 3, a third control electrode 4, and a fourth control electrode 5. The first control electrode 2 and the second control electrode 3 are arranged diagonally opposite one another and form a first control electrode pair. The third control electrode 4 and the fourth control electrode 5 are also arranged diagonally opposite one another and form a second control electrode pair. A trigger circuit 6 is provided for triggering the piezoelectric resonator 1. The trigger circuit 6 supplies a control signal S to the piezoelectric resonator 1. A regulating circuit 7 is provided for regulating the control signals S of the trigger circuit 6. A first switch 8 is connected between the trigger circuit 6 and the piezoelectric resonator 1. The trigger circuit 6 has an output 6b, which is coupled to an input 8a of the first switch 8. The control signal S is supplied to the input 8a of the first switch 8. The first switch 8 has a first switch position 8b and a second switch position 8c at its output side. The first switch position 8b is coupled to the third control electrode 4 and the fourth control electrode 5. The second switch position 8c is coupled to the first control electrode 2 and the second control electrode 3. A second switch 9 is arranged between the piezoelectric resonator 1 and the regulating circuit 7. The second switch has a first switch position 9a and a second switch position 9b at its input side. The second switch 9 has an output 9c which is coupled to an input 7a of the regulating circuit 7. The first switch position 9a of the second switch is coupled to the first control electrode 2 and the second control electrode 3. The second switch position 9b of the second switch is coupled to the third control electrode 4 and the fourth control electrode 5. The piezoelectric resonator 1 has a planar ground electrode 10 over its entire lower surface. The trigger circuit 6 has a ground output 6c which is coupled to the ground electrode 10 of the piezoelectric resonator 1. The regulating circuit 7 has an output 7b which is coupled to an input 6a of the trigger circuit 6.

The piezoelectric resonator 1 comprises a drive tappet 11 at its front side. The piezoelectric resonator 1 may be used for driving drive elements (not shown in FIG. 1) by means of this drive tappet 11, for example for driving the shaving head of an electric shaver. The piezoelectric resonator 1 can be excited into oscillation in an oscillation plane (x/y plane), wherein the oscillation results from a superimposition of two mutually perpendicular vibrations in the x- and y-directions. The resonance frequencies of the two mutually perpendicular vibrations may be adjusted through a suitable triggering and through a suitable choice of the geometry of the piezoelectric resonator 1 such that the two vibrations are excited with a sufficient amplitude and in a desired phase relation, and the drive tappet 11 of the piezoelectric resonator 1 moves along a curve lying in the x/y plane, in particular an ellipse-shaped curve e. Such an oscillation along the ellipse-shaped curve e may be generated both in a first, clock-wise drive direction 12 and in a second, anti-clock-wise drive direction 13 through a suitable triggering of the piezoelectric resonator 1. The first control electrode 2 and the second control electrode 3 are provided for triggering the piezoelectric resonator in the first drive direction 12. The third control electrode 4 and the fourth control electrode 5 are provided for triggering the piezoelectric resonator 1 in the second drive direction 13.

For triggering the piezoelectric resonator 1 in the second drive direction 13, the first switch 8 will be in the switch position 8b shown in FIG. 1, and the second switch 9 will be in the first switch position 9a shown in FIG. 1. For this second drive direction 13, the control signal S is supplied by the trigger circuit 6 via the switch 8 in its first switch position 8b in parallel both to the third control electrode 4 and to the fourth control electrode 5. This control signal S excites the piezoelectric resonator 1 such that it moves in the second drive direction 13. The first control electrode 2 and the second control electrode 3 are connected to the input 7a of the regulating circuit 7 via the second switch 9 which is in its first switch position 9a. The first control electrode 2 and the second control electrode 3 thus supply a feedback signal K to the regulating circuit 7. The feedback signal K supplies the regulating circuit 7 with a status description of the oscillation of the piezoelectric resonator 1. The regulating circuit 7 evaluates the feedback signal K and supplies a regulating signal R to the trigger circuit 6. The control signal S supplied by the trigger circuit 6 to the piezoelectric resonator 1 is modified by means of this regulating signal R.

The regulating circuit 7 is designed either for evaluating the amplitude of the feedback signal K or for evaluating the phase difference between the control signal S and the feedback signal K. For evaluating the amplitude of the feedback signal K, it is necessary for the regulating circuit 7 to comprise an analog-digital converter. If the phase difference between the control signal S and the feedback signal K is to be evaluated, the regulating circuit 7 will comprise a phase detector. Such a phase detector can be realized in a particularly simple and inexpensive manner.

The regulating signal R supplied by the regulating circuit 7 may be used for regulating the frequency of the control signal S, for regulating the amplitude of the control signal S, or for regulating the frequency and amplitude of the control signal S.

For triggering the piezoelectric resonator 1 in the first drive direction 12, the first switch 8 will be in the second switch position 8c and the second switch 9 will be in the second switch position 9b. The trigger circuit 6 supplies the control signal S to the first control electrode 2 and to the second control electrode 3 for triggering the piezoelectric resonator in the first drive direction 12. During operation in the drive direction 12, the third control electrode 4 and the fourth control electrode 5 are designed for supplying the feedback signal K to the regulating circuit 7. The latter again supplies a regulating signal R to the trigger circuit 6, so that a modification of the control signal S is possible also in the first drive direction 12.

The regulation of the control signal S and the resulting regulation of the oscillation of the piezoelectric resonator 1 render it possible to operate the piezoelectric resonator 1 at the optimum frequency at all times, i.e. at that frequency for which the efficiency is an optimum. This is particularly advantageous for piezoelectric resonators 1 with a high vibration performance, because the gradient of the performance over the frequency lies within a very narrow band. Final trimming of the frequency of the control signal S can thus continuously safeguard an optimum operation of the trigger device with the highest possible resonator performance.

In the first drive direction 12, the passive control electrodes 4 and 5, i.e. those not used for triggering the piezoelectric resonator 1, are used for obtaining the feedback signal K. In the second drive direction 13, the control electrodes 2 and 3 passive in this drive direction are used for obtaining the feedback signal K. This alternate utilization of the control electrodes on the one hand for active triggering of the resonator 1 and on the other hand for passively obtaining the feedback signal K renders possible a particularly efficient utilization and partition of the surface of the piezoelectric resonator 1. No additional sensor electrodes for obtaining the feedback signal are necessary in such an arrangement. The active piezo volume, i.e. the volume present under the control electrodes which are active at any time, is not reduced by additional sensor electrodes. The drive device is particularly efficient also for this reason.

Figure 2:
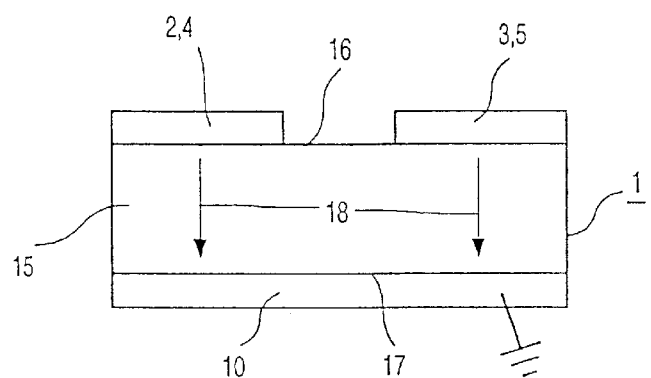
FIG. 2 is a lateral elevation of the piezoelectric resonator of FIG. 2.

FIG. 2 shows the piezoelectric resonator of FIG. 1 in side elevation. The piezoelectric resonator 1 comprises a piezoelectric base body 15 with a first surface 16 and a second surface 17. The second surface 17 is fully covered by the ground electrode 10. The first surface 16 supports the first control electrode 2, the second control electrode 3, the third control electrode 4, and the fourth control electrode 5. The polarization direction of the piezoelectric base body 15 is the same below the control electrodes 2, 3, 4, and 5. The polarization direction is indicated with two arrows 18 in FIG. 2. The oscillation modes of the piezoelectric resonator 1 are stimulated by the D-31 piezo effect.

Figure 3:
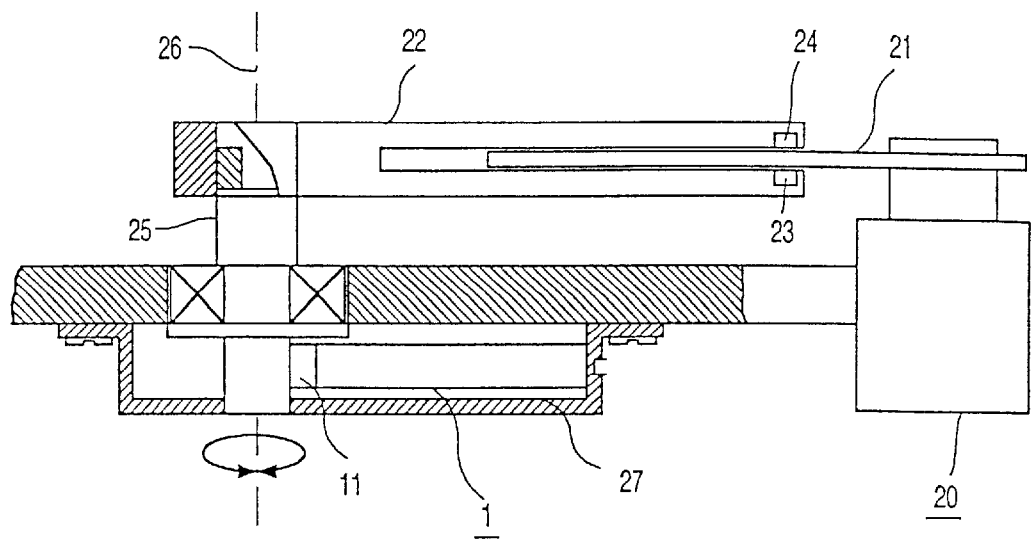
FIG. 3 shows a CD drive unit with a piezoelectric drive device as shown in FIG. 1.

FIG. 3 shows a CD drive unit with a piezoelectric drive device as shown in FIG. 1. In this drive unit, an arm 22 provided with a read/write head 23, 24 is moved in radial direction over a CD 21, which is driven by a motor 20. The arm 22 is arranged on a shaft 25 which is rotatable about an axis of rotation 26 and which is driven by a piezoelectric drive device according to FIG. 1. The piezoelectric resonator 1 is for this purpose accommodated in a housing 27 which is pretensioned against the shaft 25. A force is transmitted to the shaft 25 through the drive tappet 11, which shaft is rotatable in both directions depending on the triggering of the piezoelectric resonator 1, so that the arm 22 moves in the desired direction over the CD 21.

Figure 4:
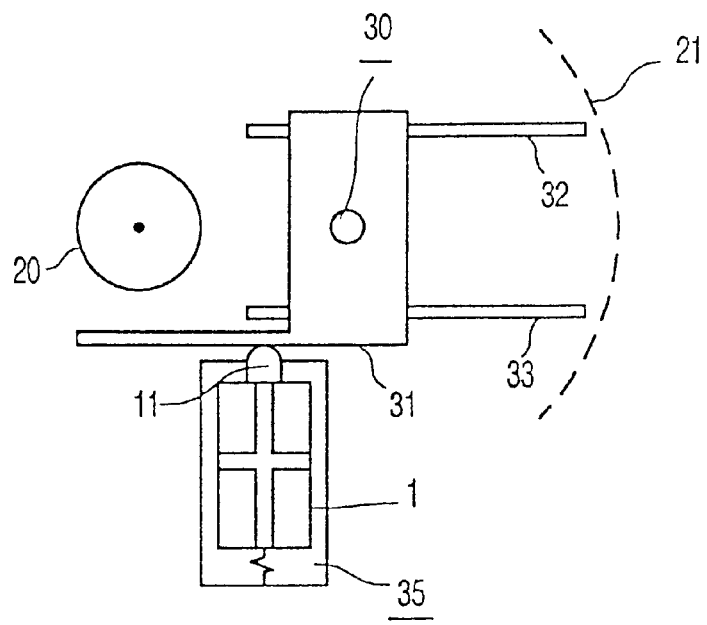
FIG. 4 shows a further embodiment of a CD drive unit with a piezoelectric drive device as shown in FIG. 1.

FIG. 4 shows a further embodiment of a CD drive unit with a piezoelectric drive device 35. The read/write head is concealed behind a lens 30 here. The entire read/write unit is mounted on a carriage 31 and is moved linearly in radial direction over the CD 21 along two guides 32, 33 by means of the piezoelectric drive device 35. The piezoelectric drive element 35 may here be fixedly incorporated in the housing of the CD drive unit and hit against the carriage 31 with its drive tappet 11, thus moving this carriage.

Figure 5:
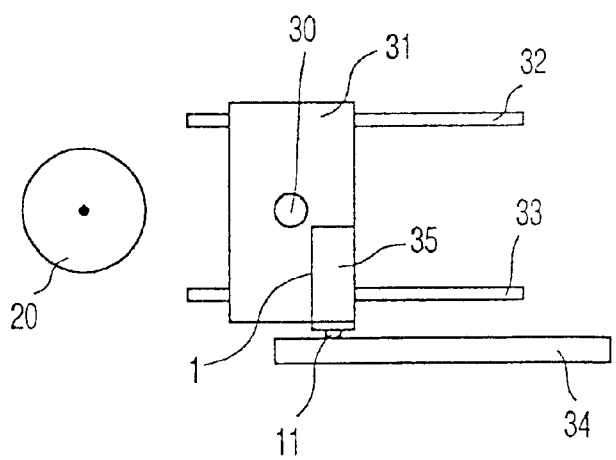
FIG. 5 shows a third embodiment of a CD drive unit with a piezoelectric drive device as shown in FIG. 1.

A further embodiment is shown in FIG. 5, where the piezoelectric drive unit 35 is mounted on the carriage 31. The drive tappet 11 hits against the drive unit housing 34. The result is that the piezoelectric drive device 35 and the carriage 31 move jointly.

Figure 6:
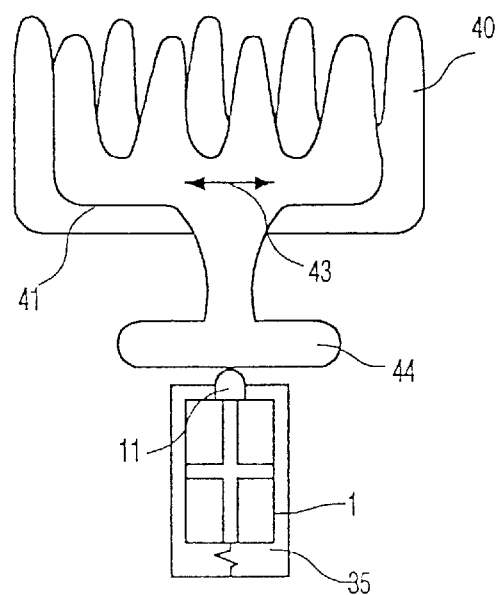
FIG. 6 is a sketch showing the construction principle of a beard trimmer of an electric shaver which is driven by a piezoelectric drive device as shown in FIG. 1.

FIG. 6 is a sketch showing the construction principle of a beard trimmer of an electric shaver. The beard trimmer, which is provided in particular for cutting longer hairs, comprises a stationary comb 40 and a moving comb 41. The moving comb 41 can be driven into oscillation in the direction of the double arrow 43 by means of the piezoelectric drive device 35. The moving comb 41 preferably comprises a T-shaped extension 44 with which the drive tappet 11 makes contact.

The triggering and regulating mechanisms for the piezoelectric resonator 1 are not shown in FIGS. 2 to 6 to keep the drawings clear and simple.

What is claimed is:

1. A piezoelectric drive device comprising a bimodal piezoelectric resonator (1) and means for supplying control signals (S), wherein said resonator (1) comprises:
at least a first control electrode (2) for triggering the resonator (1) in a first drive direction, and
at least an other control electrode (4) for triggering the resonator in a second drive direction, and said means for supplying control signals comprises a trigger circuit (6) for supplying control signals (S) to the first and the other control electrode, characterized in that the device further comprises a regulating circuit (7) for regulating the control signals (S), first means for supplying a feedback signal (k) from the other control electrode (4) to the regulating circuit (7) when the resonator is not being triggered by said other control electrode and the resonator (1) is being triggered in the first drive direction by means of the first control electrode (2), and second means for supplying a feedback signal (k) from the first control electrode (2) to the regulating circuit (7) when the resonator is not being triggered by said first control electrode and the resonator (1) is being triggered in the second drive direction by means of the other control electrode (4).

2. A piezoelectric drive device as claimed in claim 1, wherein said other control electrode is a third electrode (4), characterized in that the piezoelectric resonator (1) comprises a first pair of control electrodes (2,3) consisting of said first electrode (2) and a second electrode (3) for triggering the resonator in the first drive direction, and a second pair of control electrodes (4,5) consisting of a third electrode which is said other electrode (4) and a fourth electrode (5) for triggering the resonator in the second drive direction, the second pair of control electrodes (4,5) is designed for supplying a feedback signal (k) to the regulating circuit (7) when the resonator is not being triggered by said second pair of electrodes and the resonator (1) is being triggered in the first drive direction by the first pair of control electrodes (2,3), and the first pair of control electrodes (2,3) is designed for supplying a feedback signal (k) to the regulating circuit (7) when the resonator is not being triggered by said first pair of elves and the resonator (1) is being triggered in the second drive direction by the second pair of control electrodes (4,5).

3. A piezoelectric drive device as claimed in claim 1, characterized in that the piezoelectric resonator (1) is substantially rectangular in shape, and in that one control electrode is provided in each quadrant of the substantially rectangular piezoelectric resonator (1).

4. A piezoelectric drive device as claimed in claim 1, characterized in that the regulating circuit (7) evaluates the amplitude of the feedback signal (k).

5. A piezoelectric drive device as claimed in claim 1, characterized in that the regulating circuit (7) evaluates the phase difference between the control signal (S) and the feedback signal (k) by means of a phase control (PLL) circuit.

6. A piezoelectric drive device as claimed in claim 1, characterized in that the regulating circuit (7) regulates the frequency of the control signal (S).

7. A piezoelectric drive device as claimed in claim 1, characterized in that the regulating circuit (7) regulates the amplitude of the control signal (S).

8. A piezoelectric drive device as claimed in claim 1, characterized in that the regulating circuit (7) regulates the frequency of the control signal (S) in a first step, and regulates the amplitude of the control signal (S) in a second step.

9. An electric shaver with a rotating and/or oscillating shaving head, characterized in that the shaver comprises a piezoelectric drive device as claimed in claim 1 for driving the shaving head.

10. An electronic device for reading data stored on disc-type data carriers, in particular CDs and DVDs, and/or for writing data on disc-type data carriers by means of a write/read unit, characterized in that the electronic device comprises a piezoelectric drive device as claimed in claim 1 for driving the write/read unit.

11. A piezoelectric drive device comprising a bimodal piezoelectric resonator (1) and means for supplying control signal (S), wherein said resonator (1) comprises:

at least a first control electrode (2) for triggering the resonator (1) in a first drive direction, and at least an other control electrode (4) for triggering the resonator in a second drive direction, and said means for supplying control signals comprises a trigger circuit (6) for supplying control signals (S) to the first and the other control electrode, characterized in that:

said means for supplying control signals provides the control signals alternatively to the first control electrode or to the other control electrode for producing corresponding movement alternatively in the first or in the second drive direction, the device further comprises a regulating circuit (7) for regulating the control signals (S), first means for supplying a feedback signal (k) from the other control electrode (4) to the regulating circuit (7) when the resonator (1) is being triggered in the first drive direction by means of the first control electrode (2), and second means for supplying a feedback signal (k) from the first control electrode (2) to the regulating circuit (7) when the resonator (1) is being triggered in the second drive direction by means of the other control electrode (4).

12. The piezoelectric drive device claimed in claim 11, characterized in that said means for supplying control signals comprises a single trigger circuit only, and further comprises first switching means for coupling said control signals (S) alternatively to said first control electrode (2) or said other electrode (4).

13. The piezoelectric drive device claimed in claim 12, characterized in that said first and second means for supplying a feedback signal comprise second switching means for coupling said feedback signals (k) alternatively from said first control electrode (2) or from said other electrode (4).

14. The piezoelectric drive device claimed in claim 12, wherein said other control electrode (4) is a third electrode (4), characterized in that the piezoelectric resonator (1) comprises a first pair of control electrodes (2,3) consisting of said first electrode (2) and a second electrode (3) for triggering the resonator in the first drive direction, and a second pair of control electrodes (4,5) consisting of said third electrode (4) and a fourth electrode (5) for triggering the resonator in the second drive direction, the second pair of control electrodes (4,5) supplies a second feedback signal (k) to the regulating circuit (7) when the resonator (1) is being triggered in the first drive direction by the first pair of control electrodes (2,3), and the first pair of control electrodes (2,3) supplies a first feedback signal (k) to the regulating circuit (7) when the resonator (1) is being triggered in the second drive direction by the second pair of control electrodes (4,5).

15. A piezoelectric drive device as claimed in claim 11, wherein said other control electrode is a third electrode (4), characterized in that the piezoelectric resonator (1) comprises a first pair of control electrodes (2,3) consisting of said first electrode (2) and a second electrode (3) for triggering the resonator in the first drive direction, and a second pair of control electrodes (4,5) consisting of a third electrode (4) and a fourth electrode (5) for triggering the resonator in the second drive direction, the second pair of control electrodes (4,5) supplies a second feedback signal (k) to the regulating circuit (7) when the resonator (1) is being triggered in the first drive direction by the fist pair of control electrodes (2,3), and the first pair of control electrodes (2,3) supplies a first feedback signal (k) to the regulating circuit (7) when the resonator (1) is being triggered in the second drive direction by the second pair of control electrodes (4,5).

16. A piezoelectric drive device as claimed in claim 11, characterized in that the regulating circuit (7) evaluates the phase difference between the control signal (S) and the feedback signal (k) by means of a phase control (PLL) circuit.

17. A piezoelectric drive device as claimed in claim 11, characterized in that the regulating circuit (7) regulates the amplitude of the control signal (S).

18. A piezoelectric drive device as claimed in claim 11, characterized in that the regulating circuit (7) regulates the frequency of the control signal (S) in a first step, and regulates the amplitude of the control signal (S) in a second step.

19. An electric shaver with a rotating and/or oscillating shaving head, characterized in that the shaver comprises a piezoelectric drive device as claimed in claim 11 for driving the shaving head.

20. An electronic device for reading data stored on disc-type data carriers, in particular CDs and DVDs, and/or for writing data on disc-type data carriers by means of a write/read unit, characterized in that the electronic device comprises a piezoelectric drive device as claimed in claim 11 for driving the write/read unit.

\* \* \* \* \*